US012681387B2

(12) United States Patent
Park et al.

(10) Patent No.: US 12,681,387 B2

(45) Date of Patent: Jul. 14, 2026

(54) PHOTORESIST COMPOSITIONS FOR EUV AND METHODS FOR MANUFACTURING SEMICONDUCTOR DEVICES USING THE SAME

(71) Applicant: Samsung Electronics Co., Ltd., Suwon-si (KR)

(72) Inventors: Juhyeon Park, Hwaseong-si (KR); Ji Yup Kim, Suwon-si (KR); Jinjoo Kim, Seoul (KR); Hyunwoo Kim, Seongnam-si (KR); Sung Hwan Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 768 days.

(21) Appl. No.: 18/148,449

(22) Filed: Dec. 30, 2022

(65) Prior Publication Data

US 2023/0229083 A1 Jul. 20, 2023

(30) Foreign Application Priority Data

Jan. 17, 2022 (KR) ........................ 10-2022-0006726

(51) Int. Cl.

| | |
|---|---|
| ***G03F 7/039*** | (2006.01) |
| ***C08F 220/28*** | (2006.01) |
| ***G03F 7/20*** | (2006.01) |
| ***H10P 50/00*** | (2026.01) |
| ***H10P 76/20*** | (2026.01) |

(52) U.S. Cl.

CPC .......... *G03F 7/039* (2013.01); *C08F 220/281* (2020.02); *G03F 7/2004* (2013.01); *H10P 50/691* (2026.01); *H10P 50/71* (2026.01); *H10P 50/73* (2026.01); *H10P 76/2041* (2026.01)

(58) Field of Classification Search

CPC ...... G03F 7/039; G03F 7/2004; G03F 7/0045; G03F 7/0046; G03F 7/0397; G03F 7/11; G03F 7/004; C08F 220/281; C08F 220/22; C08F 220/606; H01L 21/0274; H01L 21/308; H01L 21/31144; H01L 21/32139; H01L 21/0275; H10P 50/691;

(Continued)

(56) References Cited

U.S. PATENT DOCUMENTS

| | | | |
|---|---|---|---|
| 7,288,362 | B2 | 10/2007 | Allen et al. |
| 7,608,390 | B2 | 10/2009 | Khojasteh et al. |

(Continued)

FOREIGN PATENT DOCUMENTS

| | | | |
|---|---|---|---|
| JP | 2006052373 | A | 2/2006 |
| JP | 2012048075 | A | 3/2012 |

(Continued)

*Primary Examiner* — Caleen O Sullivan

(74) *Attorney, Agent, or Firm* — Wolf, Greenfield & Sacks, P.C.

(57) ABSTRACT

Provided are photoresist compositions for EUV and methods for manufacturing a semiconductor device using the same. The photoresist compositions for EUV include a photosensitive resin, a photoacid generator, and an additive, wherein the additive comprises a copolymer including a first repeating unit that includes a fluoroalkyl group or hydrocarbon group substituted with one or more fluoroalkyl group(s), and a second repeating unit that includes a sulfonic acid group and an amide group.

20 Claims, 3 Drawing Sheets

(58) Field of Classification Search
CPC ...... H10P 50/71; H10P 50/73; H10P 76/2041; H10P 76/2042
USPC ....................................... 430/6, 270.1, 271.1
See application file for complete search history.

(56) References Cited

U.S. PATENT DOCUMENTS

| | | | | |
|---|---|---|---|---|
| 8,003,309 | B2 | 8/2011 | Ito et al. | |
| 8,088,537 | B2 | 1/2012 | Hatakeyama et al. | |
| 8,748,080 | B2 | 6/2014 | Wang et al. | |
| 8,945,808 | B2 | 2/2015 | David et al. | |
| 9,298,094 | B2 | 3/2016 | Okamura et al. | |
| 9,696,627 | B2 | 7/2017 | Wang et al. | |
| 2007/0254235 | A1* | 11/2007 | Allen | G03F 7/0757 430/270.1 |
| 2010/0183977 | A1* | 7/2010 | Wang | H01L 21/0274 430/319 |

FOREIGN PATENT DOCUMENTS

| | | | |
|---|---|---|---|
| JP | 2014016643 | A | 1/2014 |
| KR | 10-2009-0084748 | A | 8/2009 |
| KR | 10-2012-0038371 | A | 4/2012 |
| KR | 10-2013-0035941 | A | 4/2013 |
| KR | 10-2014-0100468 | A | 8/2014 |
| KR | 10-2015-0079455 | A | 7/2015 |
| KR | 20170017825 | A | 2/2017 |
| KR | 20180030486 | A | 3/2018 |
| KR | 10-2019-0079616 | A | 7/2019 |
| WO | 2017170167 | A1 | 10/2017 |

* cited by examiner

PHOTORESIST COMPOSITIONS FOR EUV AND METHODS FOR MANUFACTURING SEMICONDUCTOR DEVICES USING THE SAME

CROSS-REFERENCE TO RELATED APPLICATION

This application claims priority from Korean Patent Application No. 10-2022-0006726 filed on Jan. 17, 2022 in the Korean Intellectual Property Office and all the benefits accruing therefrom under 35 U.S.C. 119, the contents of which are herein incorporated by reference in their entirety.

FIELD

The present inventive concept relates to photoresist compositions for extreme ultraviolet (EUV) radiation and methods for manufacturing semiconductor devices using the same. More specifically, the present inventive concept relates to photoresist compositions for EUV that include an additive and methods for manufacturing semiconductor devices using the same.

BACKGROUND

Photolithography processes that use a photoresist composition may be used to form various patterns in semiconductor devices. For example, in an exposure process, a photoresist film may be divided into exposed and non-exposed parts, and the exposed part or the non-exposed part may be removed through a developing process to form a photoresist pattern. Next, a desired pattern may be formed by patterning an etching target film using the photoresist pattern as an etching mask.

As design rules of semiconductor devices are gradually reduced, there is a demand for techniques for forming smaller patterns. To satisfy such technical requirements, lithography processes that utilize extreme ultraviolet (EUV) wavelengths may be used. In particular, in mass production processes of nano-class semiconductor devices of 40 nm or less, EUV radiation having a wavelength of about 10 nm to about 14 nm may be used.

SUMMARY

Aspects of the present inventive concept provide photoresist compositions for EUV in which defects due to the developing process are reduced.

Aspects of the present inventive concept also provide methods for manufacturing a semiconductor device using a photoresist composition for EUV in which defects due to the developing process are reduced.

However, aspects of the present inventive concept are not restricted to those set forth specifically herein. Other aspects of the present inventive concept will become apparent to one of ordinary skill in the art to which the present inventive concept pertains by referencing the detailed description of the present inventive concept given below.

According to aspects of the present inventive concept, provided is a photoresist composition for EUV that comprises a photosensitive resin, a photoacid generator, and an additive, wherein the additive comprises a copolymer including a first repeating unit and a second repeating unit. In some embodiments, the first repeating unit has a structure of Chemical formula 1-1:

[Chemical formula 1-1]

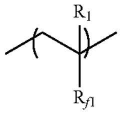

wherein $R_1$ is a hydrogen atom, a hydroxy group, or a substituted or unsubstituted alkyl group having 1 to 4 carbon atoms, and $R_{f1}$ is a fluoroalkyl group or is a hydrocarbon group substituted with one or more fluoroalkyl group(s).

In some embodiments, the second repeating unit has a structure of Chemical formula 2:

[Chemical formula 2]

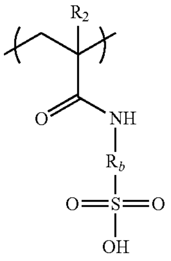

wherein $R_2$ is a hydrogen atom, a hydroxy group, or a substituted or unsubstituted alkyl group having 1 to 4 carbon atoms, and $R_b$ is a single bond, a substituted or unsubstituted alkylene group having 1 to 10 carbon atoms, a substituted or unsubstituted arylene group having 6 to 18 carbon atoms, a substituted or unsubstituted arylalkylene group having 6 to 18 carbon atoms, or a substituted or unsubstituted alkylarylene group having 6 to 18 carbon atoms.

According to aspects of the present inventive concept, provided is a photoresist composition for EUV that comprises a photosensitive resin, a photoacid generator, a photodecomposable quencher, and an additive, wherein the additive comprises a copolymer including a first repeating unit and a second repeating unit, wherein the first repeating unit has a structure of Chemical formula 1-2:

[Chemical formula 1-2]

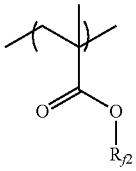

wherein $R_{f2}$ is a fluoroalkyl group or is a hydrocarbon group substituted with one or more fluoroalkyl group(s); and wherein the second repeating unit has a structure of Chemical formula 2:

[Chemical formula 2]

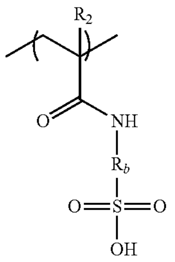

wherein $R_2$ is a hydrogen atom, a methyl group or a trifluoromethyl group, and $R_b$ is a single bond, a substituted or unsubstituted alkylene group having 1 to 10 carbon atoms, a substituted or unsubstituted arylene group having 6 to 18 carbon atoms, a substituted or unsubstituted arylalkylene group having 6 to 18 carbon atoms, or a substituted or unsubstituted alkylarylene group having 6 to 18 carbon atoms.

According to aspects of the present inventive concept, provided is a method for manufacturing a semiconductor device, the method comprising sequentially forming a target film and a photoresist film on a substrate, performing an exposure process on the photoresist film, performing a developing process on the photoresist film to form a photoresist pattern, and performing an etching process on the target film using the photoresist pattern as an etching mask, wherein the photoresist film includes a photosensitive resin, a photoacid generator, and an additive, and the additive comprises a copolymer including a first repeating unit and a second repeating unit, wherein the first repeating unit has a structure of Chemical formula 1-1:

[Chemical formula 1-1]

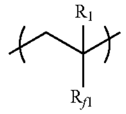

wherein $R_1$ is a hydrogen atom, a hydroxy group, or a substituted or unsubstituted alkyl group having 1 to 4 carbon atoms, and $R_{f1}$ is a fluoroalkyl group or is a hydrocarbon group substituted with one or more fluoroalkyl group(s);

and wherein the second repeating unit has a structure of Chemical formula 2:

[Chemical formula 2]

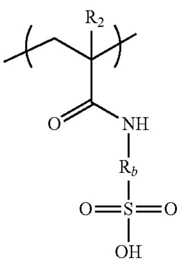

wherein $R_2$ is a hydrogen atom, a hydroxy group, or a substituted or unsubstituted alkyl group having 1 to 4 carbon atoms, and $R_b$ is a single bond, a substituted or unsubstituted alkylene group having 1 to 10 carbon atoms, a substituted or unsubstituted arylene group having 6 to 18 carbon atoms, a substituted or unsubstituted arylalkylene group having 6 to 18 carbon atoms, or a substituted or unsubstituted alkylarylene group having 6 to 18 carbon atoms.

BRIEF DESCRIPTION OF THE DRAWINGS

The above and other aspects and features of the present inventive concept will become more apparent by describing in detail example embodiments thereof with reference to the attached drawings, in which.

DETAILED DESCRIPTION OF THE EMBODIMENTS

Photoresist Compositions for EUV

Figure 1:
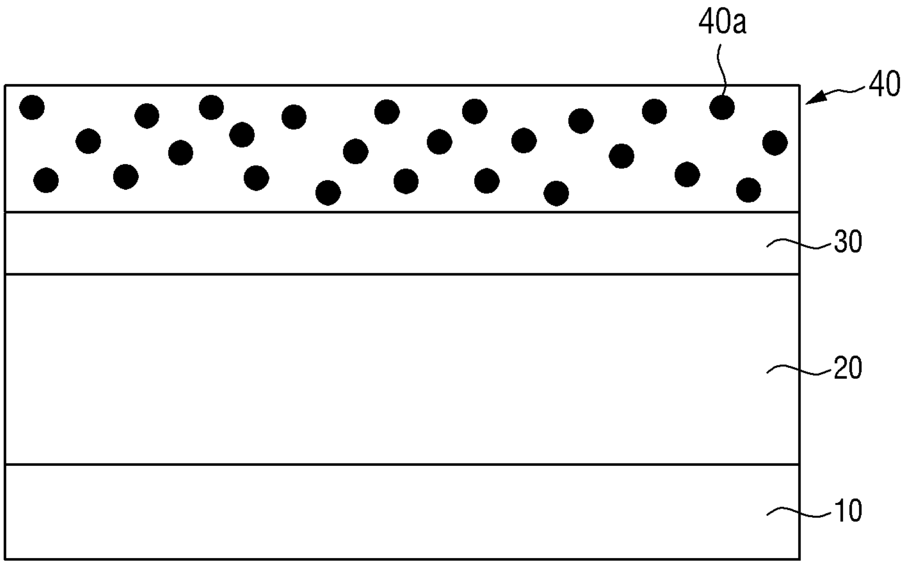
FIGS. 1 to 6 are diagrams illustrating methods for manufacturing a semiconductor device according to some embodiments.

Hereinafter, photoresist compositions for EUV according to example embodiments will be described. However, these are merely examples and the present disclosure is not limited to these embodiments.

The photoresist composition for EUV according to some embodiments includes a photosensitive resin, a photoacid generator (PAG), and an additive.

The photosensitive resin includes a polymer that undergoes a photochemical reaction upon irradiation (e.g., by extreme ultraviolet (EUV) radiation). The photosensitive resin may include, but is not limited to, at least one of a photosensitive resin used for KrF excimer laser irradiation, a photosensitive resin used for ArF excimer laser irradiation, and a hybrid photosensitive resin thereof. For example, the photosensitive resin may include, but is not limited to, one or more repeating unit(s) based on an acrylate, methacrylate, acrylic acid, methacrylic acid, vinyl ester, vinyl ether, vinyl alcohol, vinyl halide, olefin, cyclic olefin, styrene, norbornene, polyester, polyamide, polycarbonate, maleic anhydride, an unsaturated anhydride, or a combination of any of the foregoing.

In some embodiments, the photosensitive resin has a weight average molecular weight (Mw) of about 3,000 g/mol to about 600,000 g/mol. As an example, the photosensitive polymer may have a weight average molecular weight of about 3,000 g/mol to about 200,000 g/mol, or about 4,000 g/mol to about 100,000 g/mol. As an example, the weight average molecular weight of the photosensitive resin may be measured by gel permeation chromatography (GPC).

The amount or concentration of the photosensitive resin in the photoresist composition may be appropriately adjusted in consideration of the viscosity of the photoresist composition, the film coatability, the quality of the pattern, and the like. In some embodiments, the photosensitive resin may be present in the photoresist composition at a concentration of about 0.1% by weight to about 40% by weight, based on the total weight of the photoresist composition. Preferably, the photosensitive resin is present in a photoresist composition at a concentration of about 0.1% by weight to about 20% by weight, based the total weight of the photoresist composition.

In some embodiments, the photosensitive resin may include a polymer including a side chain that includes an acid decomposable protecting group. The acid decomposable protecting group, as used herein, refers to a functional group that may decompose and/or dissociate from the photosensitive resin when it reacts with an acid (e.g., a photoacid). In some embodiments, an acid (also referred to as a photoacid) may be generated from a photoacid generator upon exposure to radiation. As an example, in a chemically amplified positive photoresist process, an acid decomposable protecting group of the photosensitive resin may dissociate due to a chemical reaction (e.g., a chain reaction) with a photoacid during a post-exposure baking process. Accordingly, this may result in the exposed part of the photoresist becoming more soluble in a developer.

In some embodiments, the acid decomposable protecting group may include, for example, a cyclic aliphatic hydrocarbon group having 6 to 20 carbon atoms, such as a substituted or unsubstituted adamantyl, a substituted or unsubstituted tricyclodecanyl, a substituted or unsubstituted norbornyl, a substituted or unsubstituted isobornyl, a substituted or unsubstituted cyclopentyl, or a substituted or unsubstituted cyclohexyl. Other examples of the acid decomposable protecting group include tert-butyl, tetrahydropyranyl, tetrahydrofuranyl, ethoxyethyl, and the like. The foregoing acid decomposable protecting groups may be used alone or in combination of two or more.

The photoacid generator may generate a photoacid upon irradiation (e.g., extreme ultraviolet (EUV) radiation). Examples of photoacid generators include, but are not limited to, an onium salt, aromatic diazonium salt, sulfonium salt, triarylsulfonium salt, diarylsulfonium salt, monoarylsulfonium salt, iodonium salt, diaryliodonium salt, nitrobenzyl ester, disulfone, diazo-disulfone, sulfonate, trichloromethyl triazine, N-hydroxysuccinimide triplate, and any combination thereof.

As a particular example, the photoacid generator may include, but is not limited to, phthalimido trifluoromethane sulfonate, dinitrobenzyltosylate, n-decyldisulfone, naphthylimido trifluoromethane sulfonate, diphenyliodonium hexafluorophosphate, diphenyliodonium hexachlorofluoroarsenate, diphenyliodonium hexafluoro antimonate, diphenylparamethoxyphenyl triflate, diphenyl paratoluenyl triflate, triphenylsulfonium triflate, dibutyl naphthyl sulfonium triflate, or any combination thereof.

The amount or concentration of the photoacid generator in the photoresist composition may be appropriately adjusted in consideration of the quality of the pattern or the like. As an example, a photoacid generator may be present in the photoresist composition at a concentration of about 1% by weight to about 80% by weight, based on the total weight of the photosensitive resin. When the concentration of the photoacid generator is less than about 1% by weight of the weight of the photosensitive resin, the sensitivity to radiation (e.g., EUV) may decrease. When the concentration of the photoacid generator exceeds about 80% by weight of the weight of the photosensitive resin, the photoacid generator may excessively absorb radiation and the quality of the pattern may deteriorate. Preferably, the concentration of the photoacid generator is about 10% by weight to about 70% by weight, based on the total weight of the photosensitive resin. More preferably, the concentration of the photoacid generator, based on the total weight of the photosensitive resin, is about 20% by weight to about 60% by weight.

The additive may improve a dissolution rate of the photoresist composition in a developer. In some embodiments, the additive may increase the dissolution rate of the photoresist composition in an aqueous alkaline developer. In embodiments of the invention, the additive comprises a copolymer that includes a first repeating unit and a second repeating unit.

In some embodiments, the first repeating unit of the copolymer is a fluorinated repeating unit that includes a main aliphatic hydrocarbon chain having fluorinated hydrocarbon side chains. For example, the first repeating unit may have a structure of Chemical formula 1-1.

[Chemical formula 1-1]

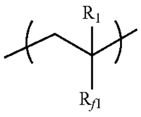

In Chemical formula 1-1, $R_1$ is a hydrogen atom, a hydroxy group, or a substituted or unsubstituted alkyl group having 1 to 4 carbon atoms. The alkyl group having 1 to 4 carbon atoms may be, for example, but is not limited to, a methyl group, an ethyl group, an n-propyl group, an isopropyl group, an n-butyl group, a sec-butyl group, a tert-butyl group or the like. Preferably, $R_1$ is a hydrogen atom or a methyl group. More preferably, $R_1$ is a methyl group.

In the Chemical formula 1-1, $R_{f1}$ is a fluoroalkyl group or a hydrocarbon group substituted with one or more fluoroalkyl group(s). Preferably, $R_{f1}$ is a perfluoroalkyl group or a hydrocarbon group substituted with one or more perfluoroalkyl group(s). As an example, in some embodiments, in the compound of Chemical formula 1-1, $R_{f1}$ is a trifluoromethyl group or a hydrocarbon group substituted with one or more trifluoromethyl group(s). The hydrocarbon group may include, in some embodiments, one or more functional groups including an ether and/or ester, and the hydrocarbon group may also be substituted with other functional groups, including, for example, one or more hydroxyl group(s).

In some embodiments, $R_{f1}$ is a hydrocarbon group having 1 to 25 carbon atoms that is substituted with one or more fluoroalkyl group(s). Preferably, $R_{f1}$ is a hydrocarbon group having 1 to 15 carbon atoms that is substituted with one or more perfluoroalkyl group(s).

As an example, Rn in Chemical formula 1-1 may include one or more of the following substituents. However, these are merely examples and the present disclosures are not limited to these embodiments. In the following substituents, * represents a substitution site. In the following substituents, n is a natural number. Preferably, n is a natural number from 3 to 10.

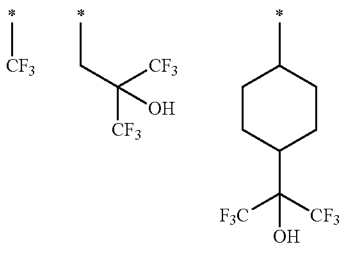

-continued

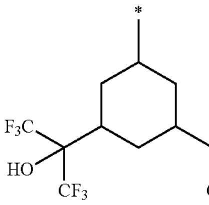

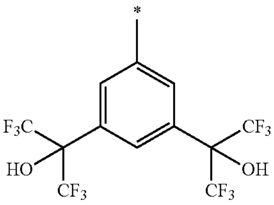

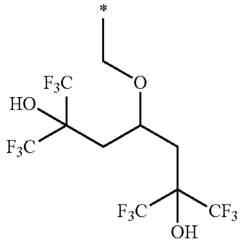

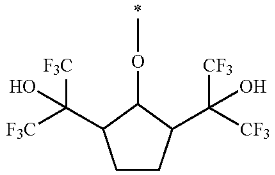

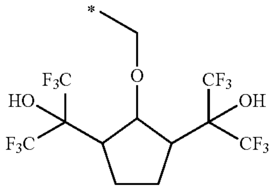

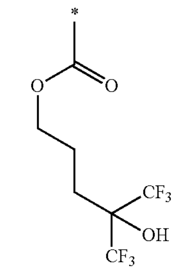

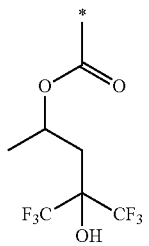

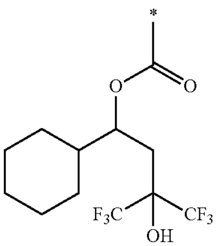

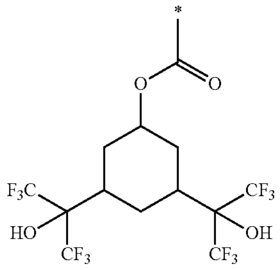

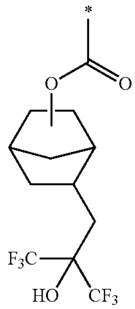

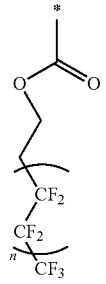

In some embodiments, the first repeating unit has a structure of Chemical formula 1-2.

[Chemical formula 1-2]

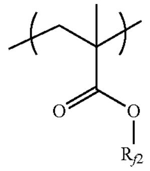

In Chemical formula 1-2, $R_{f2}$ is a fluoroalkyl group or a hydrocarbon group substituted with one or more fluoroalkyl group(s). Preferably, $R_{f2}$ is a perfluoroalkyl group or a hydrocarbon group substituted with one or more perfluoroalkyl group(s). As an example, $R_{f2}$ may be a trifluoromethyl group or a hydrocarbon group substituted with one or more trifluoromethyl group(s).

In some embodiments, $R_{f2}$ of Chemical formula 1-2 is a hydrocarbon group that is substituted with at least one trifluoromethyl group and at least one hydroxy group. Preferably, $R_{f2}$ is a hydrocarbon group having 1 to 15 carbon atoms that is substituted with at least one trifluoromethyl group and at least one hydroxy group. As an example, Raz may be a hydrocarbon group having 1 to 15 carbon atoms and including 1,1,1,3,3,3-hexafluoro-2-hydroxy-2-propyl as a substituent.

As an example, Raz may include one or more of the following substituents. However, these are merely examples and the present disclosure is not limited to these embodiments. In the following substituents, * represents a substitution site.

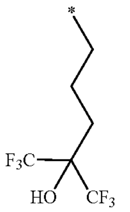

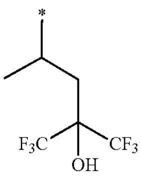

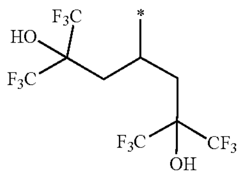

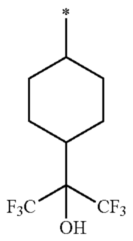

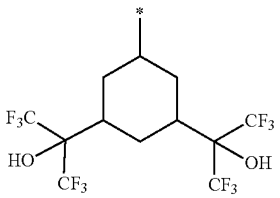

-continued

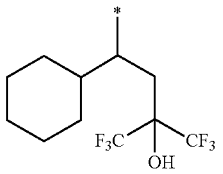

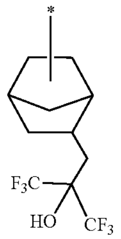

In some embodiments, Raz of Chemical formula 1-2 is a straight or branched chain perfluoroalkyl group or a hydrocarbon group substituted with a straight chain perfluoroalkyl group. Preferably, Raz is a straight chain perfluoroalkyl group having 6 to 20 carbon atoms, or $R_{f2}$ is a hydrocarbon group having 7 to 25 carbon atoms that is substituted with a straight chain perfluoroalkyl group having 6 to 20 carbon atoms.

As an example, $R_{f2}$ may include one or more of the following substituents. However, these are merely examples and the present disclosure is not limited to these embodiments. In the following substituents, * represents a substitution site. In the following substituents, n is a natural number. Preferably, n is a natural number from 3 to 10.

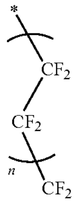

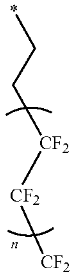

In some embodiments, the first repeating unit of the copolymer does not include an aromatic hydrocarbon group (i.e., is devoid of an aromatic hydrocarbon group). For example, $R_{f1}$ of Chemical formula 1-1 and/or $R_{f2}$ of Chemical formula 1-2 may each be a fluoroalkyl group or an aliphatic hydrocarbon group substituted with a fluoroalkyl group. In such a case, the photoresist composition for EUV including the additive may exhibit improved surface hydrophilicity.

In some embodiments, the second repeating unit is an acrylamide-based repeating unit including sulfonic acid. For example, in some embodiments, the second repeating unit has a structure of Chemical formula 2.

[Chemical formula 2]

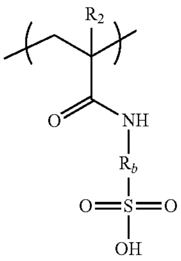

In the Chemical formula 2, $R_2$ is a hydrogen atom, a hydroxy group, or a substituted or unsubstituted alkyl group having 1 to 4 carbon atoms. The alkyl group having 1 to 4 carbon atoms may be, for example, but is not limited to, a methyl group, an ethyl group, an n-propyl group, an isopropyl group, a n-butyl group, a sec-butyl group, a tert-butyl group, or the like. Preferably, $R_2$ is a hydrogen atom, a methyl group, or a trifluoromethyl group.

In the Chemical formula 2, $R_b$ is a single bond, a substituted or unsubstituted alkylene group having 1 to 10 carbon atoms, a substituted or unsubstituted arylene group having 6 to 18 carbon atoms, a substituted or unsubstituted arylalkylene group having 6 to 18 carbon atoms, or a substituted or unsubstituted alkylarylene group having 6 to 18 carbon atoms. The alkylene group having 1 to 10 carbon atoms may be, for example, but is not limited to, a methylene group, an ethylene group, an n-propylene group, an isopropylene group, an n-butylene group, a sec-butylene group, a tert-butylene group, or the like. Examples of the arylalkylene group having 6 to 18 carbon atoms include, but are not limited to, a phenylene group or a naphthylene group. The arylalkylene group having 6 to 18 carbon atoms may include, but is not limited to, a benzylene group, a phenethylene group or the like.

As specific embodiments of the second repeating unit of Chemical formula 2, the following repeating units may be used. However, these are merely examples and the present disclosure is not limited thereto.

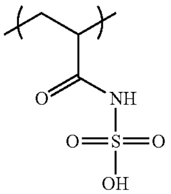

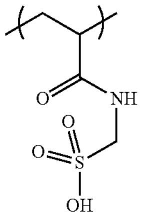

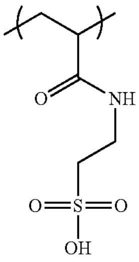

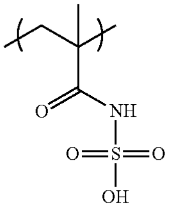

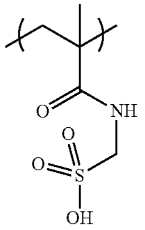

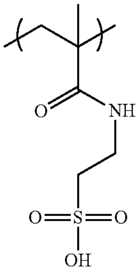

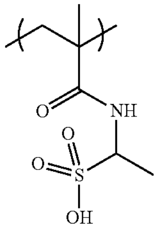

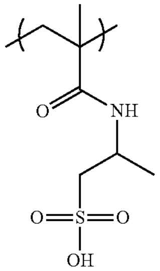

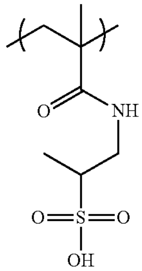

-continued

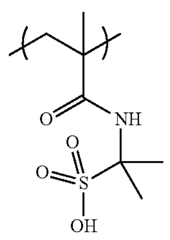

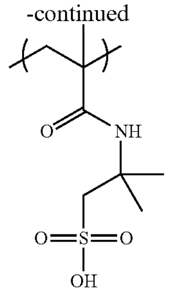

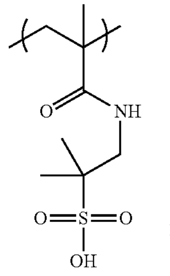

In some embodiments, $R_b$ of the second repeating unit does not include an aromatic hydrocarbon group (i.e., is devoid of an aromatic hydrocarbon group). For example, $R_b$ of the second repeating unit may be a single bond or a substituted or unsubstituted alkylene group having 1 to 4 carbon atoms. In this case, the photoresist composition for EUV including the additive may exhibit improved surface hydrophilicity.

In some embodiments, the second repeating unit is present in the copolymer at a concentration of about 1 mol % to about 40 mol %. As such, in some embodiments, in the copolymer, the molar ratio of the first repeating unit to the second repeating unit may be from about 99:1 to about 60:40. When the concentration of the second repeating unit is less than about 1 mol % in the copolymer, the additive may not have sufficient surface hydrophilicity for a precision development process. When the concentration of the second repeating unit exceeds about 40 mol % in the copolymer, the additive may not suitably self-segregate to the surface of the photoresist film. Preferably, in the copolymer, the concentration of the second repeating unit is from about 5 mol % to about 20 mol %. As such, in some embodiments, in the copolymer, the molar ratio of the first repeating unit to the second repeating unit is from about 95:5 to about 80:20.

In some embodiments, the copolymer may further include one or more additional repeating unit(s) in addition to the first repeating unit and the second repeating unit. For example, the one or more additional repeating unit(s) may include, but are not limited to, at least one of a repeating unit that includes a lactone, a repeating unit that includes an ester, and a repeating unit that includes a fluorinated hydrocarbon.

The copolymer may be, but is not limited to, a block copolymer or a random copolymer. Preferably, the copolymer is a block copolymer.

The weight average molecular weight (Mw) of the copolymer may be adjusted appropriately in consideration of the desired resolution of the pattern formed using the photoresist, the viscosity of the photoresist, the solvent used in the developing process for the photoresist, the presence or absence of defects, and the like. As an example, in some embodiments, the weight average molecular weight of the copolymer is about 500 g/mol to about 500,000 g/mol. Preferably, the weight average molecular weight of the copolymer is about 5,000 g/mol to about 50,000 g/mol. When the weight average molecular weight of the copolymer exceeds about 50,000 g/mol, the defects in the photoresist pattern may be deepened during the developing process. More preferably, the weight average molecular weight of the copolymer is about 5,000 g/mol to about 30,000 g/mol. In some embodiments, the dispersity of the molecular weight of the copolymer may be, for example, about 1.5 or less.

The concentration of the additive in the photoresist composition may be appropriately adjusted in consideration of the quality of the pattern and the like. For example, the concentration of the additive, based on the total weight of the photoresist composition, may be from about 0.001% by weight to about 5% by weight. Preferably, the concentration of the additive in the photoresist composition is about 0.01% by weight to about 1% by weight, based on the total weight of the photoresist composition.

Alternatively, in some embodiments, the concentration of the additive in the photoresist composition is about 0.01% by weight to about 50% by weight, based on the total weight of the photosensitive resin. Within this range, the additive may sufficiently increase the dissolution rate of the photoresist in an aqueous alkaline developer. This may make it possible to prevent or decrease pattern defects that may occur due to incomplete removal or reattachment of the photoresist in the developing process. Preferably, the concentration of the additive in the photoresist composition, relative to the total weight of the photosensitive resin, is about 0.1% by weight to about 20% by weight. More preferably, the concentration of the additive, relative to the total weight of the photosensitive resin, is about 1% by weight to about 10% by weight.

The photoresist composition for EUV according to some embodiments may further include a photo-decomposable quencher (PDQ) (hereinafter, “quencher”).

The quencher may improve the uniformity and planarity of the photoresist film after the post-exposure baking process. The quencher may include, for example, but is not limited to, at least one of hydrogen chloride, an ether, an ester, an alcohol, water, a fluorine compound, a cyanide, a ketone, a bromide, an iodide, an amine, an aldehyde, a phenol, a nitro compounds, or any combination thereof. As a particular example, the quencher may include triphenylsulfonium benzoate.

The amount of the quencher may be appropriately adjusted in consideration of the quality of the pattern and the like. As an example, the concentration of the quencher in the photoresist composition may be about 0.1% by weight to about 50% by weight, based on the total weight of the photosensitive resin. Preferably, the concentration of the quencher is about 1% by weight to about 40% by weight, based on the total weight of the photosensitive resin. More preferably, the concentration of the quencher is about 10% by weight to about 30% by weight, based on the total weight of the photosensitive resin.

The photoresist composition for EUV according to some embodiments may further include an organic solvent.

In some embodiments, the organic solvent may be included as the remainder of the photoresist composition for EUV. The organic solvent may dissolve the photosensitive resin or the like. As an example, the organic solvent may include, but is not limited to, at least one of a ketone such as acetone, methyl ethyl ketone, cyclohexanone, methyl isoamyl ketone and 2-heptanone; a polyhydric alcohol and/or a derivative thereof such as ethylene glycol, ethylene glycol monoacetate, diethylene glycol, diethylene glycol monoacetate, propylene glycol, propylene glycol monoacetate, dipropylene glycol, monomethyl ether of dipropylene glycol monoacetate, monoethyl ether, monopropyl ether, and monophenyl ether; a cyclic ether such as dioxane; an ester such as ethyl formate, methyl lactate, ethyl lactate, methyl acetate, ethyl acetate, butyl acetate, methyl pyruvate, methyl acetoacetate, ethyl acetoacetate, ethyl pyruvate, ethyl ethoxyacetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanoate, 3-methoxybutyl acetate, and 3-methyl-3-methoxybutyl acetate; and an aromatic hydrocarbon such as toluene and xylene. Combinations of any of the foregoing organic solvents may also be used.

Methods for Manufacturing Semiconductor Devices

Hereinafter, methods for manufacturing a semiconductor device using a photoresist composition of the invention will be described with reference to FIGS. 1 to 6. However, these are merely examples and the present disclosure is not limited to these embodiments.

FIGS. 1 to 6 are diagrams illustrating a method for manufacturing a semiconductor device according to some embodiments.

Referring to FIG. 1, a substrate 10 is provided. Subsequently, a target film 20, a mask film 30, and a photoresist film 40 are sequentially formed on the substrate 10.

In some embodiments, the substrate 10 may be bulk silicon or silicon-on-insulator (SOI). For example, the substrate 10 may be a silicon substrate or may include other materials, for example, silicon germanium, gallium arsenide, silicon germanium on insulator (SGOI), indium antimonide, lead tellurium compounds, indium arsenide, indium phosphide, gallium arsenide or gallium antimonide. In other embodiments, the substrate 10 may have an epitaxial layer formed on the base substrate, or may be a ceramic substrate, a quartz substrate, a glass substrate for a display, or the like.

The target film 20 may be formed on the substrate 10. The target film 20 may be a layer in which an image is transferred from a photoresist pattern (e.g., 45 of FIG. 4) to be described below, and converted into a predetermined target pattern (e.g., 25 of FIGS. 5 and 6).

As an example, the target film 20 may include a conductive material such as a metal, a metal nitride, a metal silicide, and/or a metal silicide nitride film. As another example, the target film 20 may include an insulating material such as silicon oxide, silicon nitride, and/or silicon oxynitride. As still another example, the target film 20 may include a semiconductor material such as polysilicon.

The mask film 30 may be formed on the target film 20. The mask film 30 may be formed by, for example, applying it onto the target film 20 using a spin coating process and then performing a baking process. The mask film 30 may include, for example, but is not limited to, a spin-on hard mask (SOH).

The photoresist film 40 may be formed on the mask film 30. The photoresist film 40 may be applied onto the mask film 30 by, for example, an application process such as a spin coating process, a dip coating process, and/or a spray coating process.

The photoresist film 40 may include one or more of the photoresist compositions of the invention. For example, the photoresist film 40 may include a photosensitive resin, a photoacid generator, an additive 40*a*, and an organic solvent. The additive 40*a* may be any of the additives for photoresist compositions described herein. For example, the additive 40*a* may comprise a copolymer including the first repeating unit and the second repeating unit, as described herein.

Figure 2:
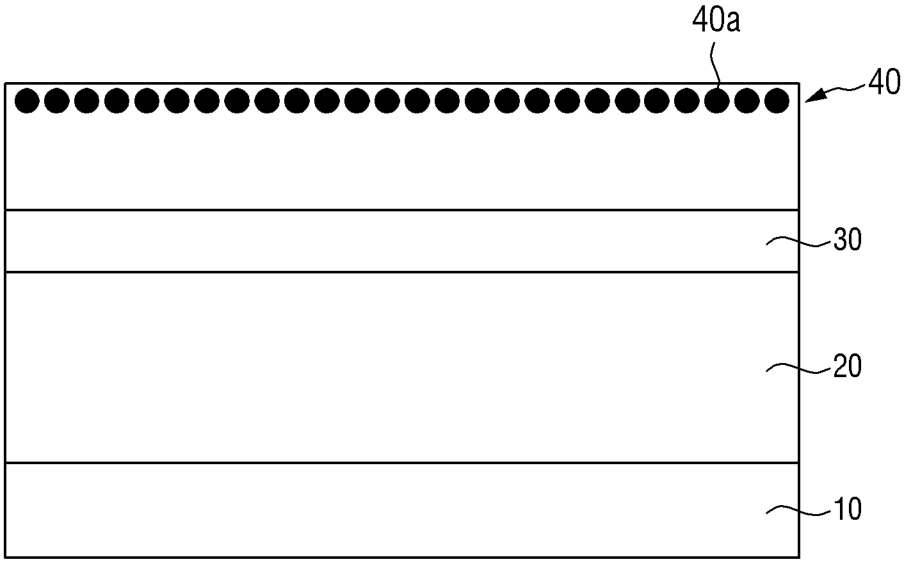

Referring to FIG. 2, the additive 40*a* may become self-segregated to the surface of the photoresist film 40.

The additive 40*a* may have a relatively low surface energy (e.g., about 40 mN/m or less) compared to other constituent components of the photoresist film 40 due to the first repeating unit being fluorinated. Therefore, additive 40*a* may be substantially distributed on the surface of the photoresist film 40 (for example, the upper surface of the photoresist film 40).

In some embodiments, a first baking process may be performed on the photoresist film 40. The first baking process may include, but is not limited to, a preliminary curing process such as a post-application baking process performed at a temperature in a range of about 50° C. to about 300° C. As the first baking process is performed, the organic solvent in the photoresist film 40 may be volatilized, and the adhesion between the mask film 30 and the photoresist film 40 may be enhanced. Further, as the first baking process is performed, the additive 40*a* may more easily self-segregate to the surface of the photoresist film 40.

Figure 3:
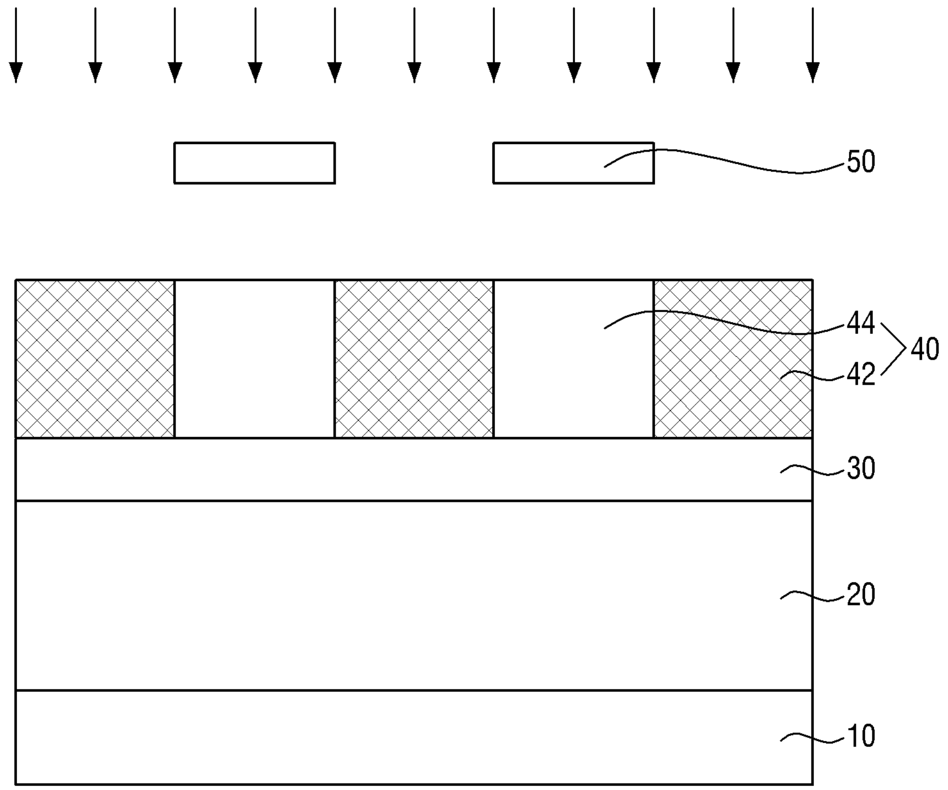

Referring to FIG. 3, an exposure process may then be performed on the photoresist film 40.

The photoresist film 40 may be divided into an exposed part 42 and a non-exposed part 44 by the exposure process. For example, an exposure mask 50 may be placed on the photoresist film 40. When radiation (e.g., a EUV beam) is directed from a radiation source through the upper part of the exposure mask 50, the radiation that passes through a transmission portion (e.g., hole or absent portion) of the exposure mask 50 may irradiate a portion of the photoresist film 40 to form the exposed part 42. The other portion of the photoresist film 40 that is not irradiated with radiation due to shielding from the exposure mask 50 may form the non-exposed part 44.

The radiation (beam) source may be, but is not limited to, a KrF excimer laser beam source, an ArF excimer laser beam source, or an extreme ultraviolet (EUV) source. In some embodiments, the beam source may be an extreme ultraviolet (EUV) source.

In some embodiments, a second baking process may be performed on the photoresist film 40 after the exposure process is performed. The second baking process may include, but is not limited to, a preliminary curing process such as a post-exposure baking process performed at a temperature in a range of about 50° C. to about 300° C. As the second baking process is performed, the solubility of the exposed part 42 may be increased relative to the solubility of the unexposed part 44. For example, the photosensitive resin of the exposed part 42 may undergo a chain chemical reaction due to the photoacid generated from the photoacid generator.

Figure 4:
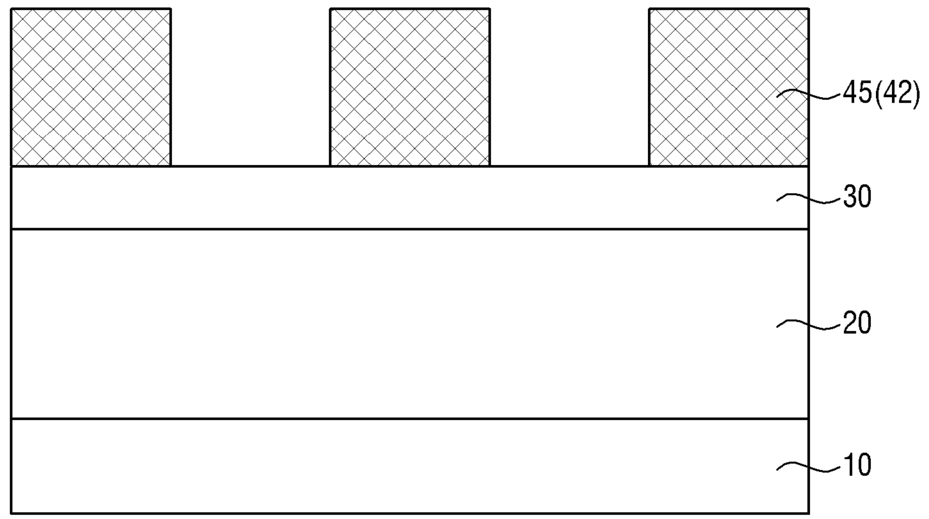

Referring to FIG. 4, a developing process may then be performed on the photoresist film 40 to form a photoresist pattern 45.

In some embodiments, a positive tone development (PTD) process may be performed. For example, due to the exposure process, the solubility of the exposed part 42 in a developer may be increased relative to the solubility of the non-exposed part 44. As a result, the exposed part 42 may be dissolved in the developer and removed in the developing process. The non-exposed part 44 may remain after the developing process to form the photoresist pattern 45. The developer may include, for example, a hydrophilic developer such as deionized water and an alcohol-based solution. In some embodiments, the developer may include an aqueous alkaline developer such as such as tetramethylammonium hydroxide (TMAH).

In the developing process, the additive 40*a* may improve the dissolution rate of the exposed part 42 of the photoresist film 40. Specifically, the additive 40*a* may have a relatively high dissolution rate in a hydrophilic developer due to the second repeating unit being an acrylamide-based repeating unit. In particular, as described above, the second repeating unit of the additive 40*a* may have higher solubility in an aqueous alkaline developer (e.g., TMAH) due to the sulfonic acid group which is an acidic functional group.

As the design rules of the semiconductor elements are gradually reduced, a lithography process that utilizes extreme ultraviolet (EUV), which has a short wavelength radiation beam, may be utilized. In such an EUV lithography process, since precise development is required to form a fine pattern, control of defects caused by the developing process has become an important issue. For example, existing photoresists have the problem that the dissolution rate of a photoresist portion (e.g., exposed part 42) in a hydrophilic developer (particularly, an aqueous alkaline developer) is insufficient and the photoresist is not developed precisely in the developing process (for example, there may be defects at a boundary surface between the exposed part 42 and the non-exposed part 44).

However, methods for manufacturing a semiconductor device according to some embodiments of the present invention, defects due to the developing process may be reduced by utilizing a photoresist composition of the invention (e.g., that includes additive 40*a*). Specifically, as described above, since the copolymer of the additive 40*a* includes the first repeating unit, which is a fluorinated repeating unit, and the second repeating unit, which is an acrylamide-based repeating unit, the surface hydrophilicity is increased and the dissolution rate of the photoresist in a hydrophilic developer (particularly, an aqueous alkaline developer) can be improved. This makes it possible to provide a method for manufacturing a semiconductor element in which defects due to the developing process are reduced and precise development is enabled.

In some embodiments, a contact angle of water on the photoresist film 40 may be 80° or less. For example, the contact angle of water on the photoresist film 40 may be about 65° to about 80°. When the contact angle of water on the photoresist film 40 exceeds about 80°, the photoresist film 40 may not have sufficient the surface hydrophilicity required for a precise development process.

In some embodiments, the surface energy of the photoresist film 40 may be about 30 mN/m or more. For example, the surface energy of the photoresist film 40 may be about 30 mN/m to about 40 mN/m. When the surface energy of the photoresist film 40 is less than about 30 mN/m, the photoresist film 40 may not have sufficient surface hydrophilicity required for a precise development process. When the surface energy of the photoresist film 40 exceeds about 40 mN/m, the additive 40*a* may not easily self-segregate to the surface of the photoresist film 40.

Figure 5:
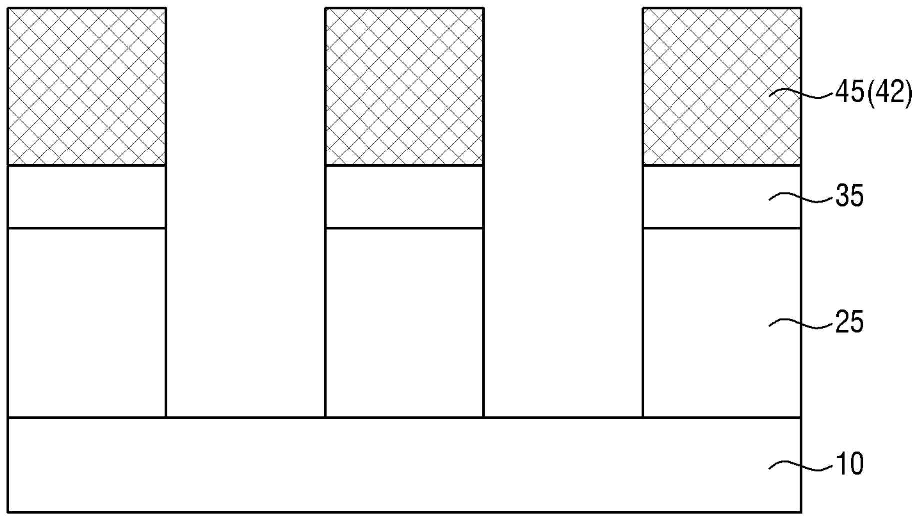

Referring to FIG. 5, the target film 20 may be patterned using the photoresist pattern 45 as an etching mask.

For example, the mask pattern 35 and the target pattern 25 may be formed by performing an etching process on the mask film 30 and the target film 20 using the photoresist pattern 45 as an etching mask. In some embodiments, the etching process may include a dry etching process or a wet etching process depending on the substance constituting the target film 20, the etching selectivity between the photoresist pattern 45 and the target film 20, and the like.

Figure 6:
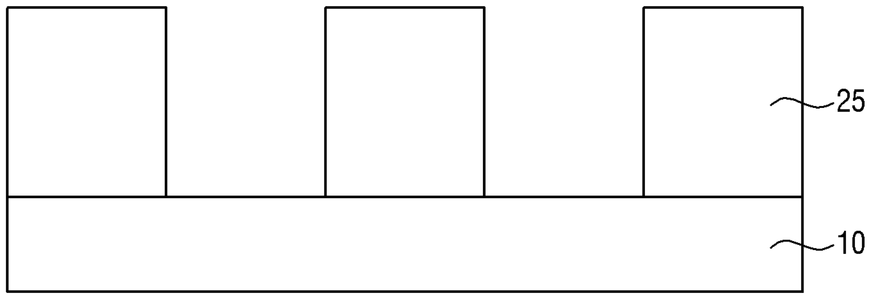

Referring to FIG. 6, the mask pattern 35 and the photoresist pattern 45 may then be removed.

The mask pattern 35 and the photoresist pattern 45 may be removed, for example, by an ashing process and/or a strip process.

Accordingly, the target pattern 25 may be formed on the substrate 10. When the target film 20 includes a conductive material, the target pattern 25 may form a predetermined conductive pattern. When the target film 20 includes an insulating material, the target pattern 25 may form a predetermined insulating pattern. When the target film 20 includes a semiconductor material, the target pattern 25 may form a predetermined semiconductor pattern.

Hereinafter, the photoresist composition for EUV according to some embodiments of the invention will be described more specifically referring to the following examples and the following comparative examples.

Example 1

The additive copolymer may be manufactured through a copolymerization reaction that uses a monomer corresponding to the first repeating unit and a monomer corresponding to the second repeating unit.

A compound of Structural formula 1-1 was used as the monomer corresponding to the first repeating unit and a compound of Structural formula 1-2 was used as the monomer corresponding to the second repeating unit.

[Structural formula 1-1]

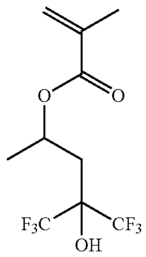

[Structural formula 1-2]

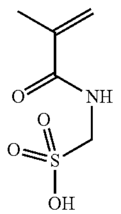

The first monomer and the second monomer were mixed at a molar ratio of 90:10 using DMF (dimethylformamide) as a solvent, and a radical polymerization reaction was performed at a room temperature for 1 day using AIBN (azobisisobutyronitrile) as an initiator. Next, the polymerization products were precipitated three times using an n-hexane solution and dried. As a result, the copolymer of Structural formula 1-3 was formed.

[Structural formula 1-3]

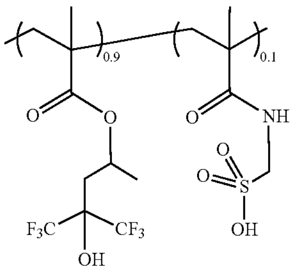

A photoresist composition for EUV was formed using poly(hydroxystyrene-co-propylcyclopentylmethacrylate) as the photosensitive resin, triphenylsulfonium difluoromethylsulfonate as the photoacid generator, the copolymer of Structural formula 1-3 as the additive, and propylene glycol methyl ether acetate and propylene glycol methyl ether as the solvents.

1.05 parts by weight of poly(hydroxystyrene-co-propylcyclopentylmethacrylate) was used on the basis of 100 parts by weight of the formed photoresist composition for EUV. Further, 0.25 parts by weight of triphenylsulfonium difluoromethylsulfonate was used as the photoacid generator on the basis of 1 part by weight of poly(hydroxystyrene-co-propylcyclopentylmethacrylate), and 0.05 parts by weight of the copolymer of Structural formula 1-3 was used as the additive. The remainder of the composition was solvent.

Example 2

A copolymer was formed in a manner similar to Example 1 except that the compound of Structural formula 2-1 was used as the monomer corresponding to the second repeating unit.

[Structural formula 2-1]

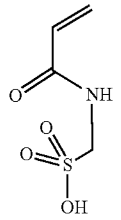

As a result, a copolymer of Structural formula 2-2 was formed and was used as the additive.

[Structural formula 2-2]

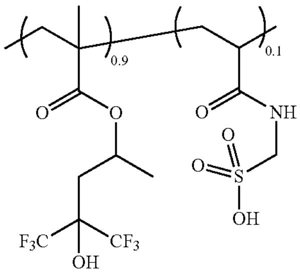

Further, a photoresist composition for EUV was formed in the manner similar to Example 1 above, except that the copolymer of Structural formula 2-2 was used as the additive.

Example 3

A copolymer was formed in a manner similar to Example 1 except that the compound of Structural formula 3-1 was used as the monomer corresponding to the second repeating unit.

[Structural formula 3-1]

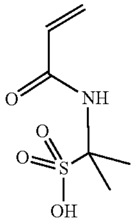

As a result, the copolymer of Structural formula 3-2 was formed and used as the additive.

[Structural formula 3-2]

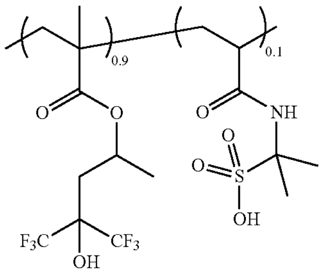

Further, a photoresist composition for EUV was formed in a manner similar to Example 1 except that the copolymer of Structural formula 3-2 was used as the additive.

Comparative Example 1

A photoresist composition for EUV was formed in a manner similar to Example 1 except that the copolymer of Structural formula 4 was used as the additive.

[Structural formula 4]

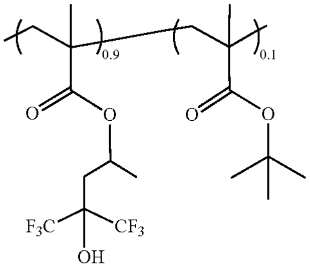

Comparative Example 2

A photoresist composition for EUV was formed in a manner similar to Example 1 except that the copolymer of Structural formula 5 was used as the additive.

[Structural formula 5]

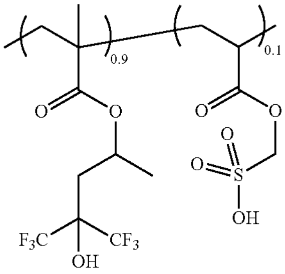

EVALUATION

A photoresist film was formed using the photoresist compositions of Examples 1 to 3 and Comparative Examples 1 and 2, and the surface energy and contact angle of water of the formed photoresist films were evaluated and the results are shown in Table 1 below. The photoresist film was formed using the method for manufacturing a semiconductor device described above using FIGS. 1 and 2.

TABLE 1

| SAMPLE | Surface energy (mM/m) | Contact angle (°) |
| --- | --- | --- |
| Example 1 | 33.5 | 72.5 |
| Example 2 | 35.8 | 70 |
| Example 3 | 31.1 | 78 |
| Comparative example 1 | 24.4 | 89 |
| Comparative example 2 | 30.6 | 80 |

Referring to Table 1 above, the photoresist films according to Examples 1 to 3 exhibit a relatively high surface energy of 30 mN/m or more and a relatively low contact angle of 80° compared with the photoresist film according to Comparative Example 1 which does not include a sulfonic acid group. Accordingly, it is possible to confirm that the additive in the present photoresist compositions for EUV exhibit enhanced surface hydrophilicity by including the second repeating unit having a sulfonic acid group.

Further, referring to Table 1, the photoresist compositions for EUV according to Examples 1 to 3 show a relatively high surface energy and a relatively low contact angle, even when compared with the photoresist film according to Comparative example 2, which includes an acrylate-based repeating unit. Therefore, it is possible to confirm that the additives in the present photoresist compositions for EUV exhibit further enhanced surface hydrophilicity by including an acrylamide-based repeating unit as the second repeating unit.

While the present inventive concept has been particularly shown and described with reference to example embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A photoresist composition for EUV comprising:

a photosensitive resin;

a photoacid generator; and an additive, wherein the additive comprises a copolymer including a first repeating unit and a second repeating unit, wherein the first repeating unit has a structure of Chemical formula 1-1

[Chemical formula 1-1]

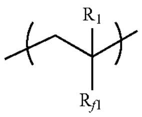

wherein $R_1$ is a hydrogen atom, a hydroxy group, or a substituted or unsubstituted alkyl group having 1 to 4 carbon atoms, and $R_{f1}$ is a fluoroalkyl group or a hydrocarbon group substituted with one or more fluoroalkyl group(s); and wherein the second repeating unit has a structure of Chemical formula 2

[Chemical formula 2]

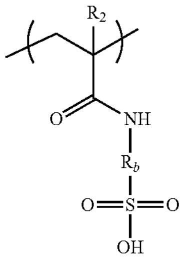

wherein $R_2$ is a hydrogen atom, a hydroxy group, or a substituted or unsubstituted alkyl group having 1 to 4 carbon atoms, and $R_b$ is a single bond, a substituted or unsubstituted alkylene group having 1 to 10 carbon atoms, a substituted or unsubstituted arylene group having 6 to 18 carbon atoms, a substituted or unsubstituted arylalkylene group having 6 to 18 carbon atoms, or a substituted or unsubstituted alkylarylene group having 6 to 18 carbon atoms.

2. The photoresist composition of claim 1, wherein $R_1$ is a methyl group.

3. The photoresist composition of claim 1, wherein the first repeating unit has a structure of Chemical formula 1-2

[Chemical formula 1-2]

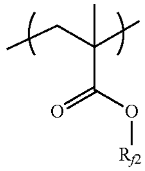

wherein $R_{f2}$ is a fluoroalkyl group or a hydrocarbon group substituted with one or more fluoroalkyl group(s).

4. The photoresist composition of claim 1, wherein $R_2$ is a hydrogen atom, a methyl group, or a trifluoromethyl group.

5. The photoresist composition of claim 1, wherein $R_b$ is a single bond or a substituted or unsubstituted alkylene group having 1 to 4 carbon atoms.

6. The photoresist composition of claim 1, wherein the copolymer comprises the second repeating unit at a concentration of 1 mol % to 40 mol %.

7. The photoresist composition of claim 1, further comprising a photo-decomposable quencher.

8. The photoresist composition of claim 1, wherein the copolymer has a weight average molecular weight of 5,000 g/mol to 50,000 g/mol.

9. The photoresist composition of claim 8, wherein a dispersity of the molecular weight of the copolymer is 1.5 or less.

10. A photoresist composition for EUV comprising:

a photosensitive resin;

a photoacid generator;

a photo-decomposable quencher; and an additive, wherein the additive comprises a copolymer including a first repeating unit and a second repeating unit, wherein the first repeating unit has a structure of Chemical formula 1-2

[Chemical formula 1-2]

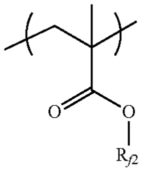

wherein $R_{f2}$ is a fluoroalkyl group or is a hydrocarbon group substituted with one or more fluoroalkyl group(s); and wherein the second repeating unit has a structure of Chemical formula 2

[Chemical formula 2]

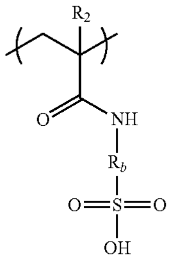

wherein $R_2$ is a hydrogen atom, a methyl group, or a trifluoromethyl group, and $R_b$ is a single bond, a substituted or unsubstituted alkylene group having 1 to 10 carbon atoms, a substituted or unsubstituted arylene group having 6 to 18 carbon atoms, a substituted or unsubstituted arylalkylene group having 6 to 18 carbon atoms, or a substituted or unsubstituted alkylarylene group having 6 to 18 carbon atoms.

11. The photoresist composition of claim 10, wherein the additive is present in the photoresist composition at a concentration of 1% by weight to 10% by weight, based on the total weight of the photoresist composition in a solid phase.

12. The photoresist composition of claim 10, wherein $R_b$ is a single bond or a substituted or unsubstituted alkylene group having 1 to 4 carbon atoms.

13. The photoresist composition of claim 10, wherein the copolymer comprises the second repeating unit at a concentration of 1 mol % to 40 mol %.

14. The photoresist composition of claim 13, wherein the copolymer comprises the second repeating unit at a concentration of 5 mol % to 20 mol %.

15. The photoresist composition of claim 10, wherein the photosensitive resin is present in the photoresist composition at a concentration of about 0.1% by weight to about 40% by weight, based on the total weight of the photoresist composition.

16. The photoresist composition of claim 15, wherein the photoacid generator is present in the photoresist composition at a concentration of 10% by weight to 70% by weight, based of the total weight of the photosensitive resin, the quencher is present in the photoresist composition at a concentration of 1% by weight to 40% by weight, based on the total weight of the photosensitive resin, and the additive is present in the photoresist composition at a concentration of 0.1% by weight to 20% by weight, based on the total weight of the photosensitive resin.

17. A method for manufacturing a semiconductor device, the method comprising:

forming a target film on a substrate;

forming a photoresist film on the target film;

performing an exposure process on the photoresist film;

performing a developing process on the photoresist film to form a photoresist pattern; and performing an etching process on the target film using the photoresist pattern as an etching mask, wherein the photoresist film comprises a photosensitive resin, a photoacid generator, and an additive, and wherein the additive comprises a copolymer including a first repeating unit and a second repeating unit, wherein the first repeating unit has a structure of Chemical formula 1-1

[Chemical formula 1-1]

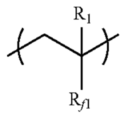

wherein $R_1$ is a hydrogen atom, a hydroxy group, or a substituted or unsubstituted alkyl group having 1 to 4 carbon atoms, and Rf is a fluoroalkyl group or a hydrocarbon group substituted with one or more fluoroalkyl group(s); and wherein the second repeating unit has a structure of Chemical formula 2

[Chemical formula 2]

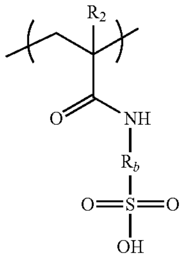

wherein $R_2$ is a hydrogen atom, a hydroxy group, or a substituted or unsubstituted alkyl group having 1 to 4 carbon atoms, and $R_b$ is a single bond, a substituted or unsubstituted alkylene group having 1 to 10 carbon atoms, a substituted or unsubstituted arylene group having 6 to 18 carbon atoms, a substituted or unsubstituted arylalkylene group having 6 to 18 carbon atoms, or a substituted or unsubstituted alkylarylene group having 6 to 18 carbon atoms.

18. The method for manufacturing the semiconductor device of claim 17, wherein the photoresist film is divided into an exposed part and a non-exposed part by the exposure process, and performing the developing process includes removal of the exposed part of the photoresist film using an alkaline developer.

19. The method for manufacturing the semiconductor device of claim 17, wherein a contact angle of water on the photoresist film is 80° or less.

20. The method for manufacturing the semiconductor device of claim 17, wherein the photoresist film has a surface energy of 30 mN/m or more.

* * * * *